(12) United States Patent
Honeycutt et al.

(10) Patent No.: US 6,482,572 B1
(45) Date of Patent: Nov. 19, 2002

(54) METHOD FOR PROVIDING AN ALIGNMENT DIFFRACTION GRATING FOR PHOTOLITHOGRAPHIC ALIGNMENT DURING SEMICONDUCTOR FABRICATION

(75) Inventors: Jeffrey W. Honeycutt, Boise; Steven M. McDonald, Meridian, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/513,000

(22) Filed: Feb. 25, 2000

(51) Int. Cl.⁷ .................................................. G03C 5/00
(52) U.S. Cl. ......................... 430/311; 430/22; 430/30; 430/313
(58) Field of Search ........................... 430/311, 22, 30, 430/313

(56) References Cited

U.S. PATENT DOCUMENTS

| | | | |
|---|---|---|---|
| 4,484,979 A | 11/1984 | Stocker | |
| 4,717,449 A | 1/1988 | Erie et al. | |
| 4,767,724 A | 8/1988 | Kim et al. | |
| 4,966,870 A | 10/1990 | Barber et al. | |
| 5,312,717 A | * 5/1994 | Sachdev et al. | 430/313 |
| 5,362,585 A | * 11/1994 | Adams | 430/311 |
| 5,504,364 A | 4/1996 | Chang et al. | |
| 5,571,745 A | 11/1996 | Horiuchi | |
| 5,572,541 A | 11/1996 | Suni | |
| 5,981,119 A | * 11/1999 | Adams | 430/311 |
| 6,027,865 A | * 2/2000 | Andoh | 430/311 |

OTHER PUBLICATIONS

Adams, Thomas E., "Applications of Latent Image Metrology in Microlithography," *SPIE vol. 1464 Integrated Circuit Metrology, Inspection, and Process Control V* (1991), pp. 294–312.

Bengtsson, Hans, et al., "Overlay and Linewidth Metrology on Latent Images," *SPIE vol. 1261 Integrated Circuit Metrology, Inspection, and Process Control IV* (1990), pp. 123–129.

Bishop, K.P., et al., "Use of Scatterometry for Resist Process Control," *SPIE vol. 1673 Integrated Circuit Metrology, Inspection, and Process Control VI* (1992), pp. 441–452.

Edmark, Karl W., et al., "Stepper Overlay Calibration Using Alignment to a Latent Image," *SPIE vol. 538 Optical Microlithography IV* (1985), pp. 91–101.

Milner, L.M., et al., "Latent Image Exposure Monitor Using Scatterometry," *SPIE vol. 1673 Integrated Circuit Metrology, Inspectioin, and Process Control VI* (1992), pp. 274–283.

Milner, Lisa M., et al., "Stepper Focus Characterization Using Diffraction from Latent Images," *J. Vac. Sci. Technol. B*, vol. 11, No. 4, Jul./Aug. 1993, pp. 1258–1266.

Nakamura, Jiro, et al., "Theoretical Study of Latent Image Formation in Chemically Amplified Resists," *Jpn. J. Appl. Phys.* vol. 33 (1994), pp. 6368–6372.

Naqvi, S. Sohail H., et al., "Diffractive Techniques for Lithographic Process Monitoring and Control," *J. Fac. Sci. Technol. B* 12(6), Nov./Dec. 1994, pp. 3600–3606.

Pforr, R., et al., "In–Process Image Detecting Technique for Determination of Overlay, and Image Quality for ASM–L Wafer Stepper," *SPIE vol. 1674 Optical/Laser Microlithography V* (1992), pp. 594–608.

Wolf, Stanley, Ph.D., *Silicon Processing for the VLSI Era*, vol. 2, Lattice Press, Sunset Beach, California, pp. 190–194.

\* cited by examiner

*Primary Examiner*—Geraldine Letscher
(74) *Attorney, Agent, or Firm*—TraskBritt

(57) ABSTRACT

The use of a resist latent image alignment mark in lieu of using dedicated discrete alignment targets defined on a semiconductor wafer and the use of field oxide step heights for alignment during the fabrication of circuit devices are disclosed. A resist latent image alignment mark is formed in a layer of photoresist material and utilized to position a mask for exposing portions of the photoresist to a radiation source to pattern locations for active areas on a semiconductor substrate. A LOCOS isolation structure is then formed around the active areas. The isolation structure is formed such that the depth of the isolation structure is adjusted to a particular radiation source wavelength. The depth of the isolation structure can then be used as a diffraction grating for stepper alignment. The height of the isolation structure can also be tuned to a particular radiation source wavelength, such that the isolation structure height may also be used as a diffraction grating for stepper alignment.

17 Claims, 12 Drawing Sheets

METHOD FOR PROVIDING AN ALIGNMENT DIFFRACTION GRATING FOR PHOTOLITHOGRAPHIC ALIGNMENT DURING SEMICONDUCTOR FABRICATION

BACKGROUND OF THE INVENTION

1. Field of the Invention

The present invention relates generally to the fabrication of semiconductor devices and, more specifically, to alignment during semiconductor fabrication. More particularly still, the present invention relates to the use of a resist latent image as a diffraction grating for the aligning and patterning of field oxide, and relates to the use of field oxide step heights for alignment during the fabrication of circuit devices.

2. State of the Art

One area involving constant improvement in semiconductor device fabrication is in the area of photolithography. Presently utilized semiconductor device processing methods require numerous photolithography steps. Thus, photolithography is one of the most critical operations in semiconductor device processing.

Photolithography is essentially a patterning process which determines the horizontal dimensions on the various components of the semiconductor devices (i.e., circuit components) by creating a mask on a particular material layer (disposed on or over a semiconductor wafer) of the semiconductor device and etching portions of the material layer through the mask to form a pattern on that material layer. The dimensions of the pattern are referred to as the image sizes of the circuit components.

Since the material layers are sequentially built up and patterned to form the semiconductor device, the photolithographic patterning process requires proper placement or alignment of each pattern on each particular material layer of the semiconductor device. The patterns formed on the various material layers must be correctly aligned and the individual parts of the circuit components must be correctly positioned relative to each other for the semiconductor device to function properly.

Naturally, the image size and pattern alignment in photolithography are interrelated. As the image size decreases, the alignment of the patterns must be more precise. Of course, image size will continue to decrease, because increased miniaturization of components and greater packaging density of integrated circuits are ongoing goals of the computer industry. Thus, as circuitry components become smaller and smaller, alignment must become more precise during masking steps to minimize the misalignment between patterned, material layers utilized in forming the circuitry components.

Most alignment schemes require the use of alignment targets that are defined on the semiconductor wafers and/or a previous material layer. One such scheme involves two alignment targets that are defined on the semiconductor wafer with all subsequent layers being aligned, either directly or indirectly, with these alignment targets. These alignment targets are used to diffract a laser alignment beam generated by a photolithographic machine, commonly known as a wafer stepper, during the masking process. The diffraction pattern is received by the wafer stepper and the relative positions of the semiconductor wafer and a photolithographic mask are adjusted accordingly so that the patterns from the photolithographic mask are transferred to the semiconductor wafer in the precise location as desired.

Subsequent layers, such as conductive material (i.e., metallization) or dielectric layers, are formed during the circuit fabrication in a similar fashion. In order to minimize misalignment between layers, it is important that the topography of these alignment targets be replicated from one layer to the next, since the locations of the resulting patterns on each material layer are formed based on the precise registration between the photolithographic mask and the alignment targets on the previous material layer.

For metallization layers, it is generally important to provide a surface that is as flat or planar as possible. Thus, the surface of the layer is smooth in preparation for subsequent metallization layers by the process known as planarization. Conventional planarization techniques include plasma etching or the reactive ion etching (RIE) of oxides with a resist planarizing medium. New techniques include abrasive planarizing in the form of chemical-mechanical polishing/planarizing ("CMP") which involves holding the semiconductor wafer against a rotating polishing pad wetted with a silica-based alkaline slurry and at the same time applying pressure. The CMP techniques provide a global planarization that covers the whole surface of the semiconductor wafer. Since the planarization range is large, the alignment targets on a newly formed layer on the semiconductor wafer will lose their steps after it is planarized. The CMP technique fails to replicate the alignment targets on the previous layer that is beneath the newly formed layer. This is acceptable only if the planarized, newly formed layer is transparent, such as in the case of silicon dioxide, since the laser or alignment beam from a wafer stepper and the corresponding diffraction pattern can pass through such a transparent layer. However, when the planarized, newly formed layer is highly reflective or opaque, such as in the case of a metal layer, the alignment targets are not visible to the wafer stepper. In such a case, new alignment targets have to be formed on the newly formed layers using a process commonly known as the window mask process.

Window mask processing involves exposing the alignment targets only while the remaining semiconductor wafer surface is covered by photoresist. The semiconductor wafer is then subjected to an oxide step of sufficient duration so that the amount of silicon dioxide removed during this etch, plus the amount of silicon dioxide to be removed during the subsequent etch, exposes the step pattern of the underlying target. This allows the metal to replicate the topography of the step patterns of the underlying alignment targets when the metal is deposited. This technique forms a new set of alignment targets. Accordingly, the wafer stepper is able to perform alignment between a photolithographic mask, the semiconductor wafer and the next photolithic process.

By way of example only, the following discussion will focus on the formation of a twin-well CMOS (Complementary Metal Oxide Semiconductor) structure using standard alignment marks. FIG. 21 illustrates a semiconductor wafer 202 in which alignment marks 204 have been formed in an active surface 206 at a location proximate an edge 208 of the semiconductor wafer 202. These alignment marks 204 are used to align the patterning of masks and implantation tools, as known in the art, to form p-wells 212 and n-wells 214 abutting the active surface 206 of the semiconductor wafer 202. The individual electrical devices are generally isolated using a LOCOS (LOCal Oxidation of Silicon) technique.

The LOCOS technique begins with forming a layer of silicon dioxide 218, usually between about 20 and 50 nm thick, on the active surface 206 of the semiconductor substrate 202, as shown in FIG. 22. After the formation of the silicon dioxide layer 218, a layer of silicon nitride 222, usually between about 100 and 200 nm thick, is deposited, generally by CVD, over the silicon dioxide layer 218 to function as an oxidation mask. The alignment marks 204 must be re-exposed in order that they are detected for alignment purposes. This can be achieved by removing a portion of the silicon nitride layer 222 and silicon dioxide layer 218 over the alignment marks 204.

Active areas 232 are then defined with photolithographic and etch steps illustrated in FIGS. 23 through 27. As shown in FIG. 23, a photoresist layer 224 is patterned on the silicon nitride layer 222 to protect all of the areas where active areas will be formed, wherein the photoresist layer 224 pattern is aligned using the alignment marks 204. The silicon nitride layer 222 and the silicon dioxide layer 218 are then etched, and any remaining photoresist layer 224 is removed, as shown in FIG. 24. A barrier layer 225 is preferably formed over the alignment marks 204 to prevent silicon dioxide formation on the alignment marks 204 in subsequent formation of isolation structures, as also shown in FIG. 24. As shown in FIG. 25, an isolation structure or field oxide 226 is formed, usually thermally grown by wet oxidation at elevated temperatures.

The silicon nitride layer 222 and barrier layer 225 are then removed to expose the silicon dioxide layer 218 and the alignment marks 204, respectively, as shown in FIG. 26. The field oxide 226 and silicon dioxide layer 218 are etched to remove the silicon dioxide layer 218 and expose active areas 232 on the p-wells 212 and n-wells 214, as shown in FIG. 27.

The active areas 232 are then used to form individual electrical devices, such as PMOS, NMOS, and CMOS transistors. For purposes of illustration, FIG. 27 also shows semiconductor-layer source regions and drain regions for a CMOS transistor. The implantation of the source regions and the drain regions is usually achieved with a double masking process wherein a first mask is applied over the active area over the n-wells 214 and an n-type impurity is introduced to the exposed active areas over the p-wells 212 to form n-type areas 236. The first mask is removed and a second mask is applied to the active areas over the p-wells 212 and a p-type impurity is introduced to the exposed active areas over the n-wells 214 to form p-type areas 238. The second mask is then removed to form the structure shown in FIG. 27. The n-type areas 236 and the p-type areas 238 are subsequently used as source/drain areas in further CMOS fabrication. Throughout this process, care must be taken to be sure that the alignment marks remain exposed in order to align the first and second mask.

The CMOS is further fabricated with the formation of gates 258 (FIG. 31) between each source and drain region. FIGS. 27 through 31 illustrate, in cross section, a conventional method of forming the gates 258. FIG. 28 illustrates a gate dielectric layer 244 such as silicon dioxide grown (by oxidation) or deposited (by any known industry standard technique, such as chemical vapor deposition or the like) over the active areas and the field oxide 226. A conductive material layer 246 is deposited over the gate dielectric layer 244, and a cap layer 248, such as silicon dioxide, is deposited on the conductive material layer 246. At this point, a photoresist layer must be positioned or patterned properly on the cap layer 248 in order to form the gates in their proper location. However, the alignment marks 204 must again be exposed (as shown in FIG. 29), such as by masking and etching, in order to align the subsequent photoresist layer pattern. Once the alignment marks 204 are exposed, the photoresist layer 252 can be patterned, as shown in FIG. 29.

The cap layer 248, the conductive material layer 246, and the gate dielectric layer 244 are then etched to form gate stacks 254 as shown in FIG. 30. A conformal layer of dielectric material (not shown), such as silicon nitride, is formed over the gate stacks 254 and anisotropically etched to form the spacers 256 on the side of the gate stacks 254, thereby forming gates 258, as shown in FIG. 31.

Because of the difficulties in preserving the alignment targets between layers, it is often desirable to use other alignment techniques. These alignment techniques might be found in other fields that use light diffraction. One such diffraction-based technique has been pursued in the field of exposure dose control to minimize the difficulty in controlling the photoresist application and exposure steps. These control problems are further outlined in Milner et al., *Stepper Focus Characterization Using Diffraction From Latent Images*, J. Vac. Sci. Technol. B, Vol. 11, No. 4, July/August 1993, pp. 1258–1266, which describes the use of resist latent images as a diffraction grating in performing stepper focus. The diffraction grating pattern comes from a latent image formed in exposed, undeveloped photoresist material. Other experimental uses of resist latent images in image alignment have only recently been undertaken and include performing focus measurement, alignment, and projection system setup.

In view of the foregoing, it would be advantageous to develop a method of fabricating semiconductor components that eliminates the necessity for independent or separate alignment marks, thereby eliminating problems associated therewith, by utilizing the resist latent images and structures inherent in the formation of the integrated circuits to achieve alignment.

BRIEF SUMMARY OF THE INVENTION

The present invention relates to the use of a resist latent image alignment mark in lieu of using dedicated discrete alignment targets defined on a semiconductor wafer and to the use of field oxide step heights for alignment during the fabrication of circuit devices.

One embodiment of the present invention involves the use of a resist latent image alignment mark. For example, this embodiment may be used in the fabrication of MOS (Metal Oxide Semiconductor) structures. In such a fabrication, a layer of silicon nitride is deposited over the silicon dioxide layer found on an active surface of a semiconductor substrate. A layer of photoresist material is then applied over the silicon nitride layer. An alignment pattern is formed in an appropriate position in the photoresist material layer by forming a latent image in the photoresist material layer. The latent image is formed by bleaching the undeveloped photoresist material layer by exposure to a specific light pattern.

The photoresist material layer is then selectively exposed to a radiation source through a mask having a desired aperture pattern defined therein by aligning the mask over the photoresist material layer with the alignment pattern. This results in the photoresist material being patterned on the silicon nitride layer to protect all of the areas where active areas will be formed. The silicon nitride and silicon dioxide layers are etched to expose portions of the semiconductor substrate. An isolation structure may then be thermally grown by wet oxidation in the exposed portions of the semiconductor substrate.

Advantageously, the need for alignment targets formed on a semiconductor wafer and the problems associated with use of such targets are eliminated through the use of a latent image in the photoresist material layer.

Another embodiment of the present invention includes the use of isolation structures or field oxides as alignment targets. The proper control of field oxide growth is critical to this embodiment in that the step heights of the field oxide can be formed to act as a diffraction grating for stepper alignment. For example, with a stepper alignment laser wavelength of about 633 Å, the optimal step height is about 1266 Å. Thus, by way of example, the field oxide can be grown to an initial total height of about 3700 Å wherein approximately 45% of the total height extends into the semiconductor substrate to yield a first step height about 1665 Å. The silicon nitride layer is then removed to expose the silicon dioxide layer. The field oxide and silicon dioxide layer are etched to remove the silicon dioxide layer and expose active areas on the semiconductor substrate. This results in a second step height (from the top of the field oxide to the semiconductor substrate) of approximately 1155 Å.

Since the field oxide is essentially transparent to a stepper alignment laser, the first step height is used to align a stepper to implant the p-wells and n-wells, as well as align a stepper to implant n-type areas and p-type areas that are subsequently used as source/drain regions.

The CMOS is further fabricated with the formation of gates between each source and drain region. A gate dielectric layer is disposed over the active areas and the field oxide. A conductive material layer is deposited over the gate dielectric layer, and a silicon dioxide cap layer is deposited on the conductive material layer. At this point, a photoresist layer must be patterned properly on the silicon dioxide cap layer in order to form the gates in their proper location. However, the conductive material layer will prevent the alignment of the photoresist pattern to the first step height.

As discussed above, the second step height was purposefully formed to be approximately 1155 Å, which is within an acceptable range of the optimal 1266 Å step height for reliable alignment performance. Since the gate dielectric layer, the conductive material layer, and the silicon dioxide cap layer are conformal, the second step height is translated to each of these layers. Thus, the third step height of the conductive material layer becomes the step height for alignment of the resist pattern for etching to form gate stacks. A conformal layer of dielectric material, such as silicon nitride, is applied over the anisotropically etched gate stacks to form the spacers on the side of the gate stacks, thereby forming gates.

In yet another embodiment of the present invention, a layer of opaque material is deposited over the active areas and the field oxide. The gate dielectric layer is deposited over the opaque material; a conductive material layer is deposited over the gate dielectric layer; and a silicon dioxide cap layer is deposited on the conductive material layer. A photoresist layer is then patterned on the silicon dioxide cap layer in order to form the gates in their proper location. The conductive material layer, however, will prevent the alignment of the photoresist pattern to the first step height.

Again, as discussed above, the second step height was purposefully formed to be approximately 1155 Å, which is within an acceptable range of the optimal 1266 Å step height for reliable alignment performance. Since the opaque material layer, the gate dielectric layer, the conductive material layer, and the silicon dioxide cap layer are conformal, the second step height is translated to each of these layers. Thus, the third step height of the conductive material layer becomes the step height for alignment of the resist pattern for selectively etching to form gate stacks atop the opaque material layer. A conformal layer of dielectric material, such as silicon nitride, is applied over the gate stacks and the opaque material layer is anisotropically etched to form the spacers on the side of the gate stacks, thereby forming gates.

A barrier dielectric material, which is substantially transparent to the laser light being used for alignment, is deposited over the opaque material layer and the gates, and is preferably planarized. Since the barrier dielectric material is substantially transparent to the laser light being used for alignment, a step height of the opaque material layer (which is the same as the second step height as translated thereto) may be used to pattern a second photoresist material. The barrier dielectric material is etched to form vias. The vias are filled with a conductive material to form conductive contacts for subsequent formation of capacitors and bitlines.

It is, of course, understood that the opaque material layer could be utilized in lieu of the first step height of the field oxide for the alignment of the stepper to implant the p-wells and n-wells, as well as alignment of a stepper to implant n-type areas and p-type areas to be used as source/drain regions, wherein the implantations occur through the opaque material layer.

BRIEF DESCRIPTION OF THE SEVERAL VIEWS OF THE DRAWINGS

While the specification concludes with claims particularly pointing out and distinctly claiming that which is regarded as the present invention, the objects and advantages of this invention may be more readily ascertained from the following description of the invention, when read in conjunction with the accompanying drawings in which:

DETAILED DESCRIPTION OF SPECIFIC EMBODIMENTS

The present invention relates to the use of a resist latent image alignment mark in lieu of using alignment targets defined on a semiconductor wafer and the use of field oxide step heights for alignment during the fabrication of circuit devices. By way of example, FIGS. 1 through 5 illustrate, in cross-section, a method for using a resist latent image alignment mark as an alignment diffraction grating during a photolithographic alignment step for the formation of isolation structures. FIGS. 6 through 10 illustrate, in cross-section, a method for using lower step heights of the isolation structures for ion implantation alignment. FIGS. 11 through 14 illustrate, in cross-section, a method for using upper step heights for the isolation structures for the formation of gates. FIGS. 15 through 23 illustrate, in cross-section, a method for using an opaque material layer and the upper step heights for the isolation structures for the formation of additional semiconductor structures.

It should be understood that the figures presented in conjunction with this description are not meant to be actual cross-sectional views of any particular portion of an actual semiconductor device, but are merely idealized representations which are employed to more clearly and fully depict the process of the invention than would otherwise be possible.

Figure 1:
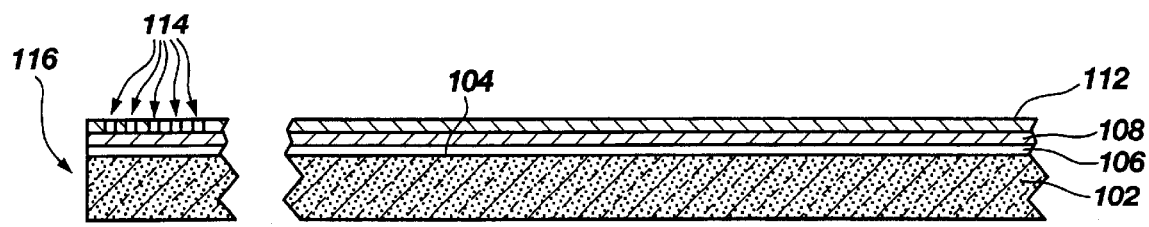
FIGS. 1–18 depict cross-sectional schematic diagrams of the processing steps of forming a latent image on field oxide for mask alignment.

For the sake of example only, the following discussion will focus on the formation of a twin-well CMOS structure utilizing the present invention. One embodiment of the present invention begins with the formation of field oxide on a semiconductor wafer. FIG. 1 illustrates a semiconductor substrate 102 with a layer of silicon dioxide 106, preferably between about 20 and 60 nm thick, on an active surface 104 of the semiconductor substrate 102. The semiconductor substrate 102 may be a semiconductor material comprising a slice of crystalline silicon (silicon wafer) or may include various semiconductive material or material layers, including without limitation silicon wafers, silicon-on-insulative (SOI) structure, silicon-on-sapphire (SOS) structure, gallium arsenide, or germanium. The silicon dioxide layer 106 may be formed by any known technique, including but not limited to: thermally growing the layer, CVD (chemical vapor deposition), and the like. The function of the silicon dioxide layer 106, also called pad or buffer oxide, is to lessen the stresses between the semiconductor substrate 102 and a subsequently deposited silicon nitride layer.

After the formation of the silicon dioxide layer 106, a layer of silicon nitride 108, usually between about 100 and 200 nm thick, is deposited, generally by CVD, over the silicon dioxide layer 106 to function as an oxidation mask. A layer of photoresist material 112, such as organic polymers including phenol-formaldehyde, polyisoprene, poly-methyl methacrylate, poly-methyl isopropenyl ketone, poly-butene1-sulfone, poly-trifluoroethyl chloroacrylate, and the like, is then applied over the silicon nitride layer 108. At least one alignment pattern 114 is formed in an appropriate position in the photoresist material layer 112 (shown in FIG. 1 proximate an edge 116 of the semiconductor substrate 102). The alignment pattern 114 is produced by forming a latent image in the photoresist material layer 112 (as yet undeveloped). The latent image is formed by bleaching the undeveloped photoresist material layer 112 by exposure to a specific light pattern.

In a preferred embodiment of the invention, the semiconductor substrate 102 was coated with 7600 Å of Sumitomo PFI-66A7 resist and then exposed on a 5xi-line stepper using 355 mj exposure energy. It is understood, however, that the latent image can be formed with any photoresist process, such as those used to process an image that is subsequently aligned to the latent image, as further described below.

Figure 2:
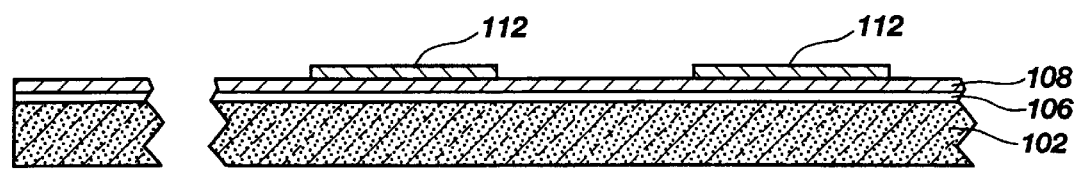
Figure 3:
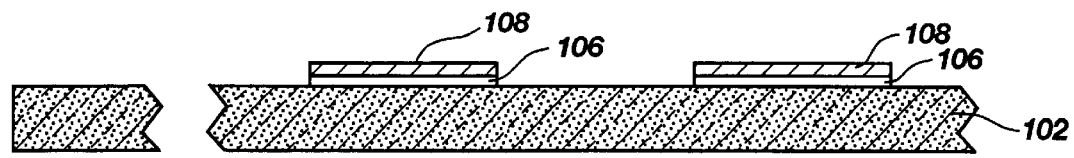

The photoresist material layer 112 then is selectively exposed to a radiation source, such as by the passage of radiation (i.e., light, e-beam, or X-rays) through a mask (not shown) having a desired aperture pattern defined therein. The mask is aligned over the photoresist material layer 112 using the alignment pattern 114. If a positive photoresist material is used, the exposure to the radiation source converts the positive photoresist material to a more soluble state which allows the exposed positive photoresist to be removed with a solvent, thereby leaving a pattern substantially identical to the mask. If a negative photoresist material is used, the exposure to the radiation source converts the negative photoresist material to a less soluble state which allows the unexposed positive photoresist to be removed with a solvent, thereby leaving a pattern substantially identical to the openings in the mask. Whether a positive or a negative photoresist material is used, the photolithographic process results in a photoresist material layer 112 on the silicon nitride layer 108 to protect all of the areas where active areas will be formed, as shown in FIG. 2. The silicon nitride layer 108 is etched, usually by a dry etch, and the silicon dioxide layer 106 is then etched, usually with either a dry or wet etch, and any remaining photoresist material layer 112 is removed, as shown in FIG. 3.

Figure 4:
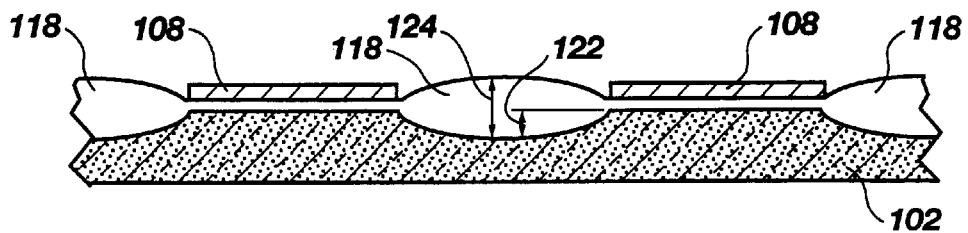
Figure 5:
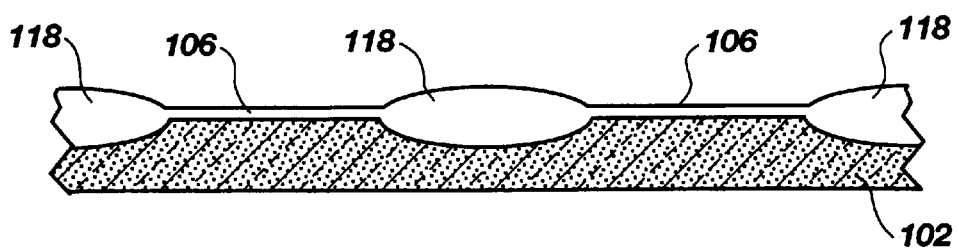
Figure 6:
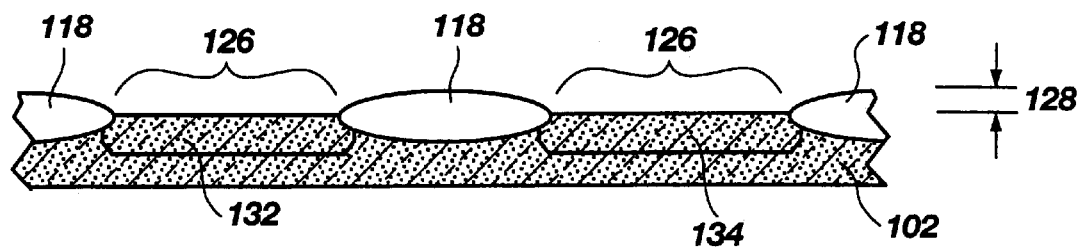

As shown in FIG. 4, an isolation structure or field oxide 118 is formed, usually thermally grown, by wet oxidation at temperatures of about 1000° C. for between about 2 and 4 hours. The proper control of the growth of the field oxide 118 is important to one aspect of the present invention, in that a first step height 122 of the field oxide 118 into the semiconductor substrate 102 is tailored to be a diffraction grating for stepper alignment. For example, with a stepper alignment laser wavelength of about 633 Å, the optimal step height is about 1266 Å. Thus, in a preferred example, the field oxide 118 is grown to an initial total height 124 of about 3700 Å wherein approximately 45% of the total height 124 extends into the semiconductor substrate 102 to yield a first step height 122 of about 1665 Å. The silicon nitride layer 108 is then removed to expose the silicon dioxide layer 106, as shown in FIG. 5. The field oxide 118 and silicon dioxide layer 106 are then etched to remove the silicon dioxide layer 106 and expose active areas 126 on the semiconductor substrate 102, as shown in FIG. 6. This purposefully results in a second step height 128 (from the top of the field oxide 118 to the semiconductor substrate 102) to be approximately 1155 Å.

Figure 7:
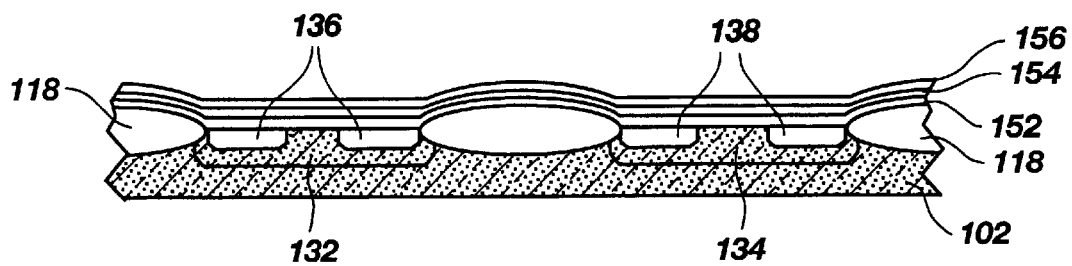

Since the field oxide 118 is essentially transparent to a stepper alignment laser, the first step height 122 can be used to align a stepper to implant the p-wells 132 and n-wells 134 (usually with a double masking procedure) shown in FIG. 6. The first step height 122 can be used to align a stepper to implant n-type areas 136 and p-type areas 138 which are subsequently used as source/drain regions (usually with a double masking procedure), as shown in FIG. 7.

The CMOS is further fabricated with the formation of gates 142 (FIG. 10) between each source and drain region. FIGS. 7–10 illustrate, in cross section, a method of forming the gates 142 according to the present invention. FIG. 7 illustrates a gate dielectric layer 152, such as silicon dioxide, grown (by oxidation) or deposited by any known industry standard technique, such a chemical vapor deposition or the like, over the active areas 126 and the field oxide 118. A conductive material layer 154 is deposited over the gate dielectric layer 152, and a silicon dioxide cap layer 156 is deposited on the conductive material layer 154, as also shown in FIG. 7. At this point, a photoresist layer must be patterned properly on the silicon dioxide cap layer 156 in order to form the gates 142 in their proper location. As formed, the conductive material layer 154 will prevent the alignment of the photoresist pattern to the first step height 122.

Figure 8:
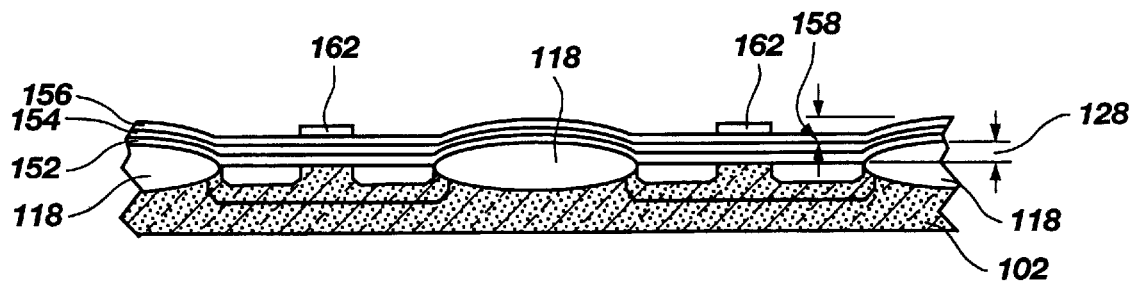
Figure 9:
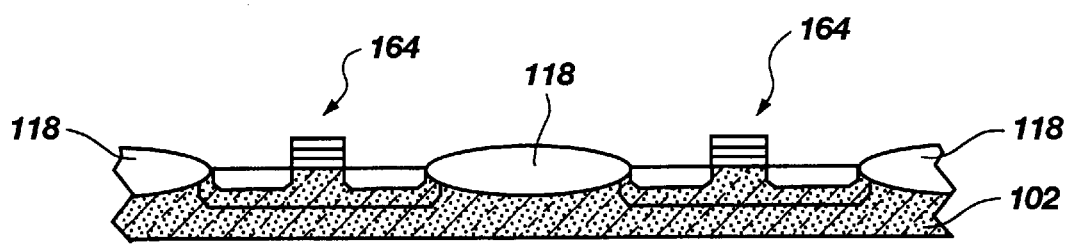
Figure 10:
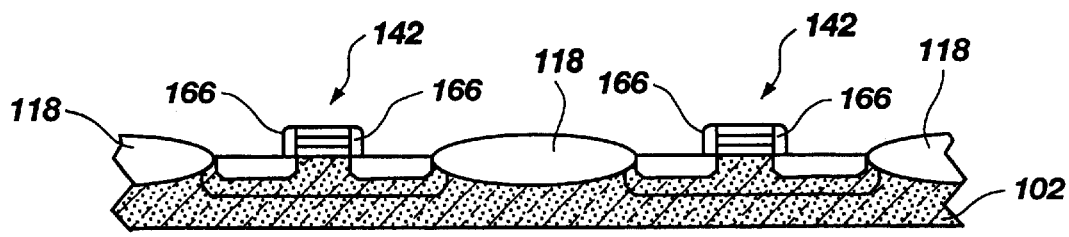

As discussed above, the second step height 128 was purposefully formed to be approximately 1155 Å, which is within an acceptable range of the optimal 1266 Å step height for reliable alignment performance. Since the gate dielectric layer 152, the conductive material layer 154, and the silicon dioxide cap layer 156 are conformal, the second step height 128 is translated to each of these layers. Thus, the third step height 158 of the conductive material layer 154 becomes the step height for alignment of the resist pattern 162 for etching, as shown in FIG. 8, to form gate stacks 164, as shown in FIG. 9. A conformal layer of dielectric material (not shown), such as silicon nitride, is applied over the gate stacks 164 and is anisotropically etched to form the spacers 166 on the side of the gate stacks 164, thereby forming gates 142, as shown in FIG. 10.

Figure 11:
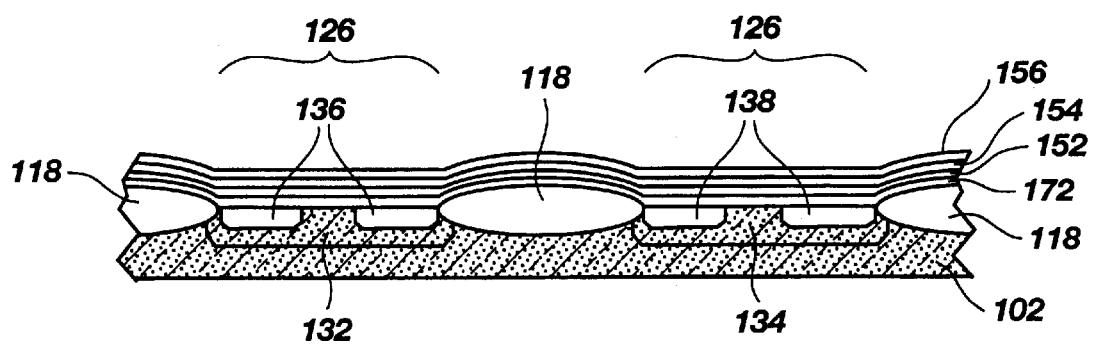

In another embodiment of the present invention, a layer of opaque material 172 is deposited over the active areas 126 and the field oxide 118, as shown in FIG. 11. The gate dielectric layer 152 is deposited over the opaque material 172. A conductive material layer 154 is deposited over the gate dielectric layer 152, and a silicon dioxide cap layer 156 is deposited on the conductive material layer 154. At this point, a photoresist layer must be patterned properly on the silicon dioxide cap layer 156 in order to form the gates 142 in their proper location. As previously described, the conductive material layer 154 will prevent the alignment of the photoresist pattern to the first step height 122.

Figure 12:
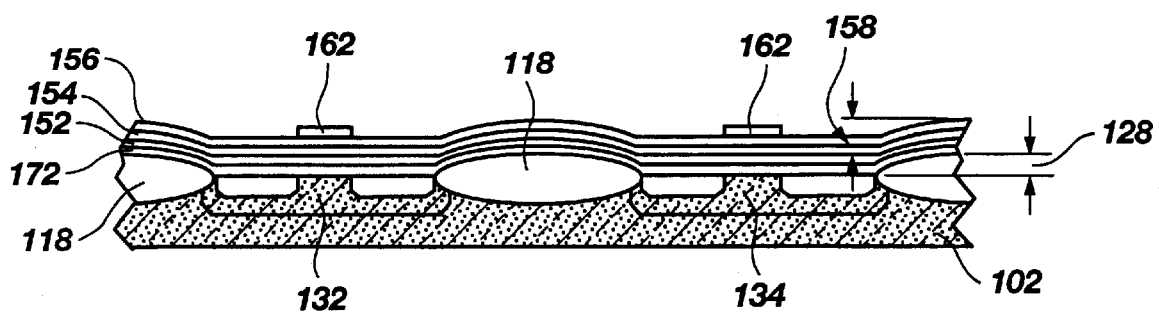
Figure 13:
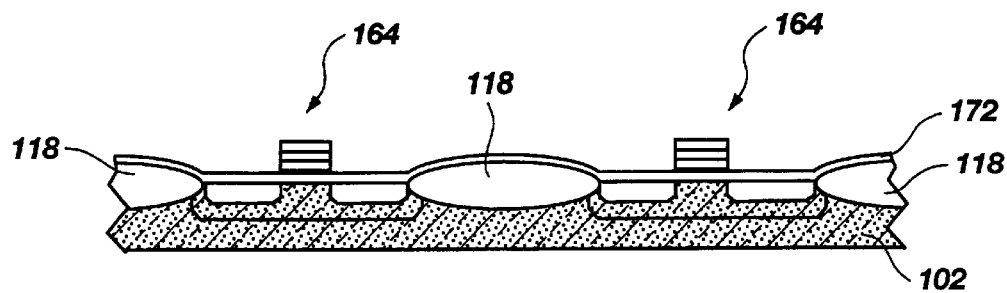
Figure 14:
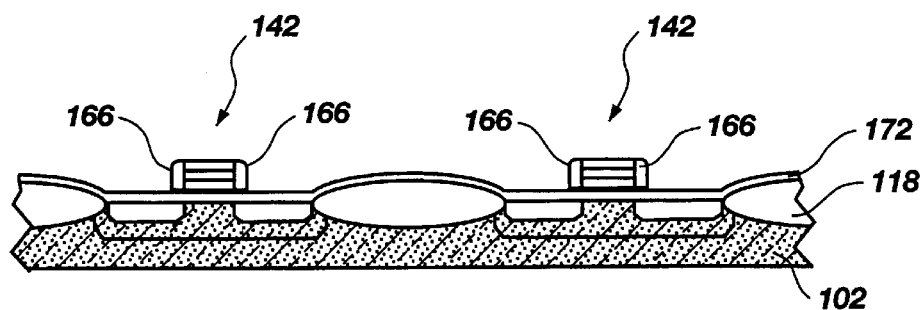

Again, as discussed above, the second step height 128 was purposefully formed to be approximately 1155 Å, which is within an acceptable range of the optimal 1266 Å step height for reliable alignment performance. Since the opaque material layer 172, the gate dielectric layer 152, the conductive material layer 154, and the silicon dioxide cap layer 156 are conformal, the second step height 128 is translated to each of these layers. Thus, the third step height 158 of the conductive material layer 154 becomes the step height for alignment of the resist pattern 162 for selectively etching, as shown in FIG. 12, to form gate stacks 164 atop the opaque material layer 172, as shown in FIG. 13. A conformal layer of dielectric material (not shown), such as silicon nitride, is applied over the gate stacks 164 and the opaque material layer 172 anisotropically etched to form the spacers 166 on the side of the gate stacks 164, thereby forming gates 142, as shown in FIG. 14.

Figure 15:
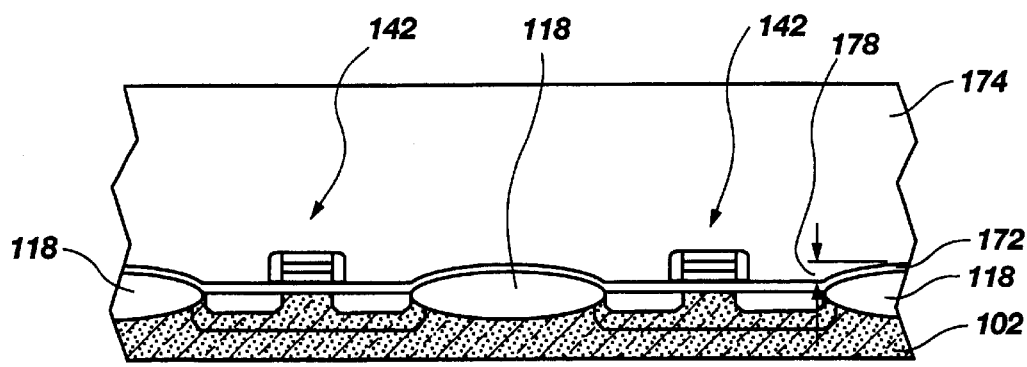
Figure 16:
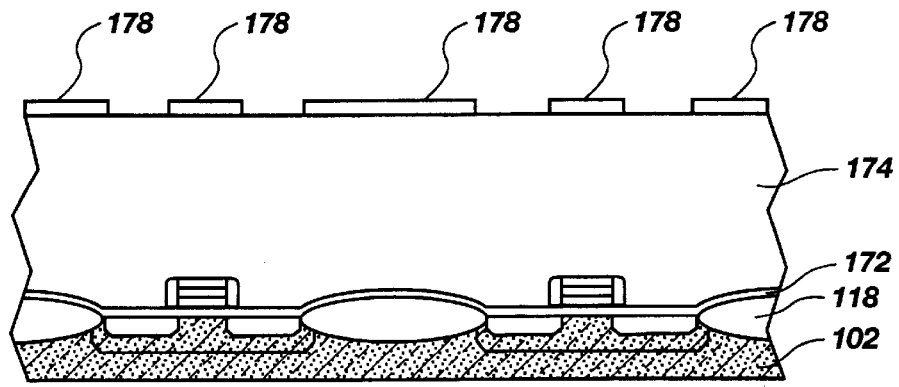
Figure 17:
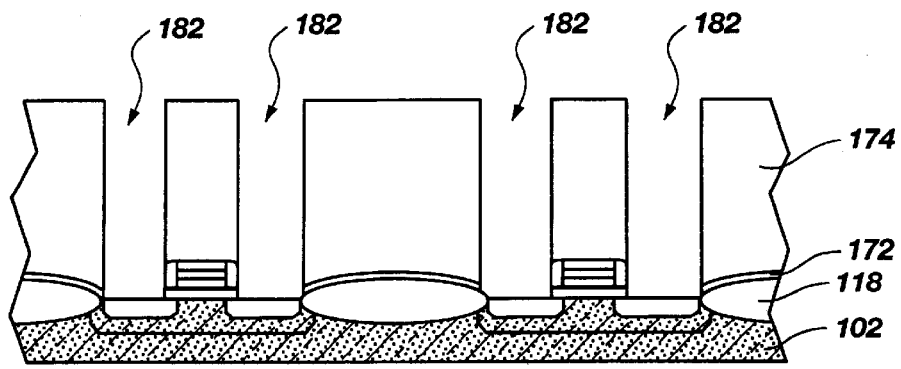
Figure 18:
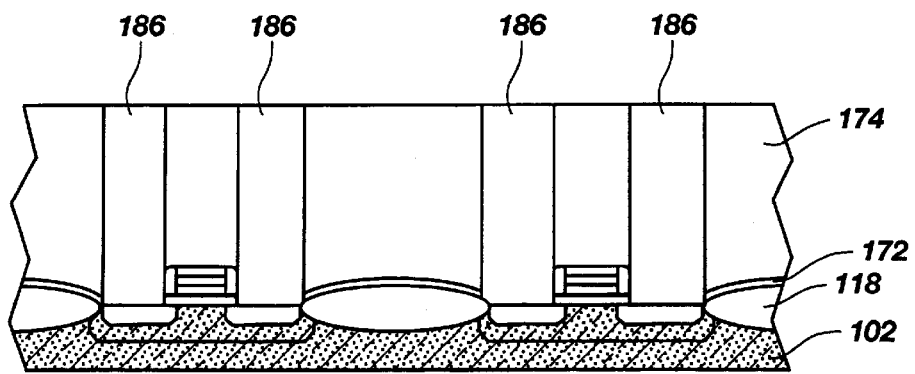

A barrier dielectric material 174, which is substantially transparent to the laser light being used for alignment, is deposited over the opaque material layer 172 and the gates 142, and preferably planarized, as shown in FIG. 15. Since the barrier dielectric material 174 is substantially transparent to the laser light being used for alignment, a step height 176 of the opaque material layer 172 (which is the same as the second step height 128 as translated thereto) may be used to pattern a second photoresist material 178, as shown in FIG. 16. The barrier dielectric material 174 is etched to form vias 182, as shown in FIG. 17. The vias 182 are filled with a conductive material to form conductive contacts 186, as shown in FIG. 18, for subsequent formation of capacitors and bitlines.

It is, of course, understood that the opaque material layer 172 could be utilized in lieu of the first step height 122 of the field oxide 118 for the alignment of the stepper to implant the p-wells 132 and n-wells 134, as previously shown in FIG. 6, as well as alignment of a stepper to implant n-type areas 136 and p-type areas 138 to be used as source/drain regions, as previously shown in FIG. 7, wherein the implantations occur through the opaque material layer 172.

Those skilled in the art will appreciate that the methods of the present invention can be utilized in a variety of semiconductor device fabrications, including but not limited to integrated circuits employed for storing or processing digital information, such as Dynamic Random Access Memory (DRAM), Static Random Access Memory (SRAM), Synchronous Graphics Random Access Memory (SGRAM), Programmable Read-Only Memory (PROM), a Electrically Erasable PROM (EEPROM), flash memory dice and microprocessor dice.

Figure 19:
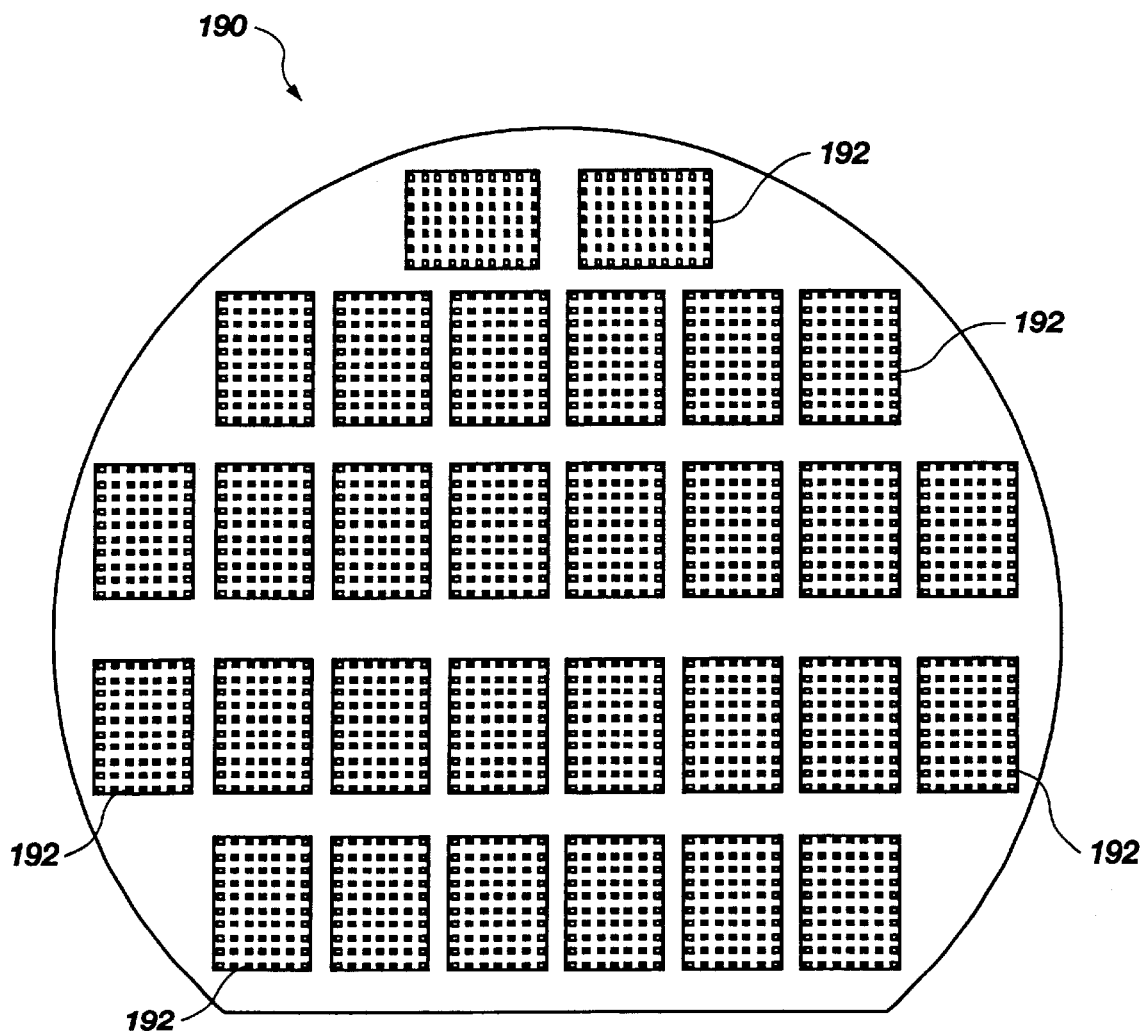
FIG. 19 is a diagram of a semiconductor wafer on which the latent image/field oxide alignment grating is fabricated according to the present invention.
Figure 20:
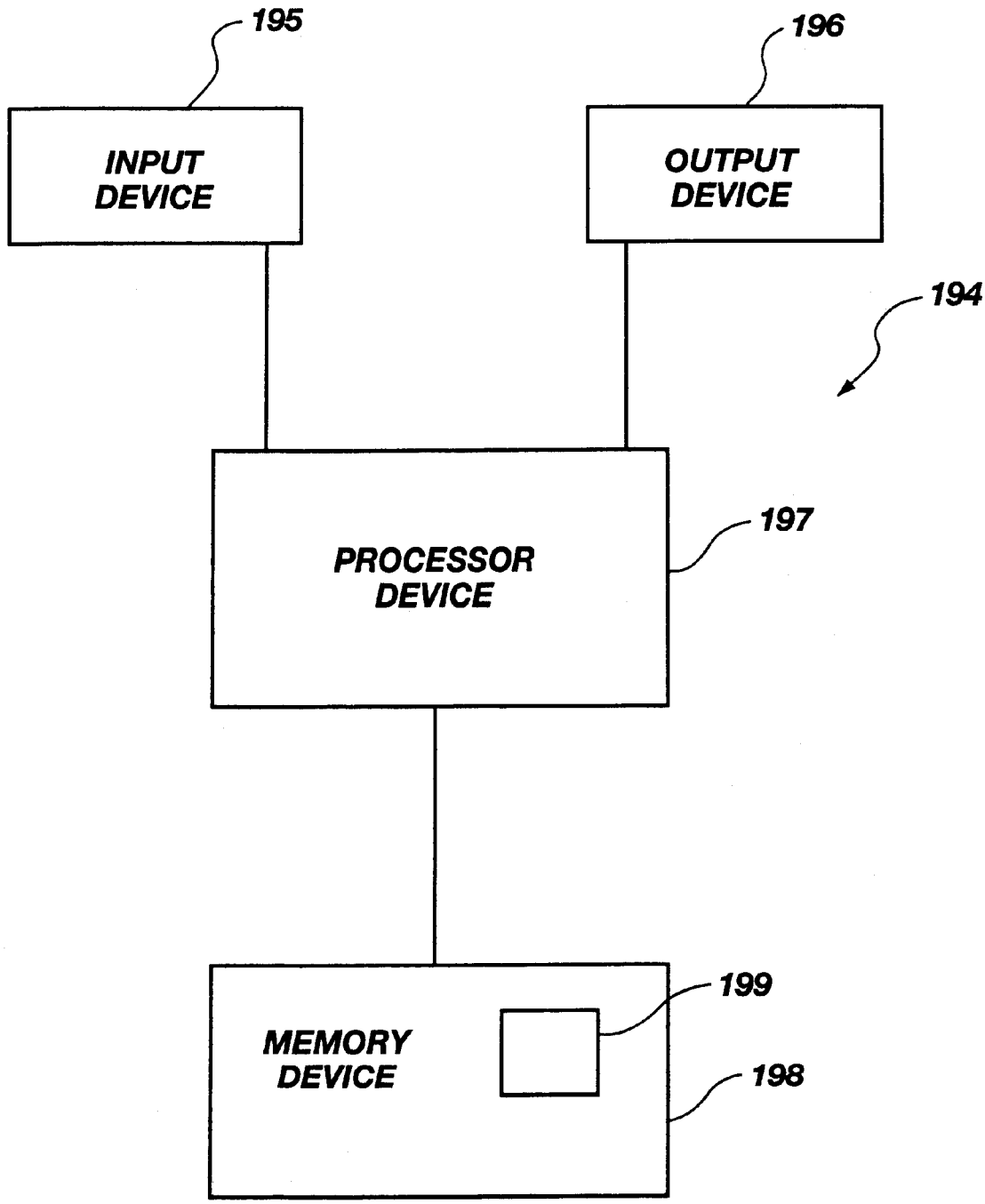
FIG. 20 is a schematic diagram of a computer system comprising a device manufactured on the semiconductor wafer according to the present invention.
Figure 21:
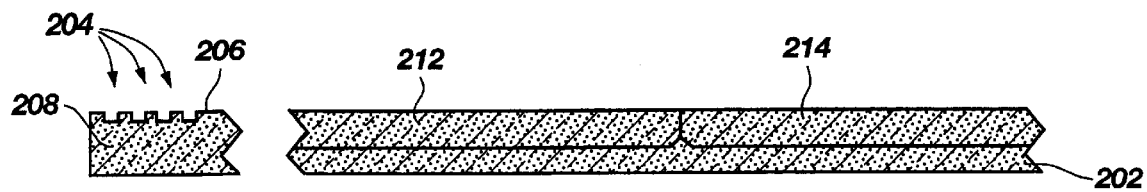
FIGS. 21–31 illustrate an exemplary prior art method of forming a CMOS structure.
Figure 22:
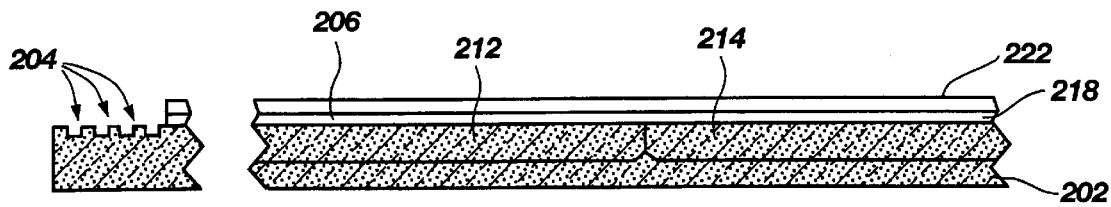
Figure 23:
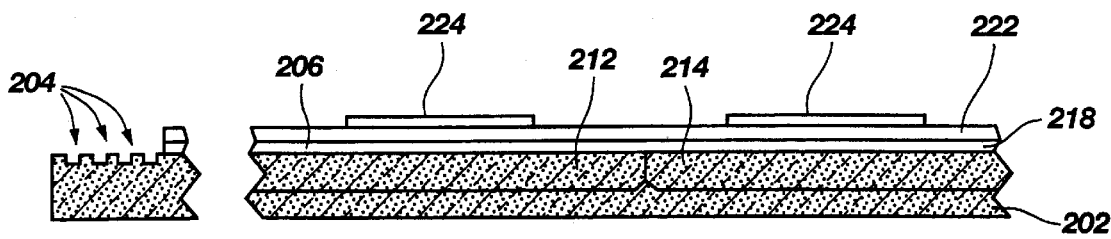
Figure 24:
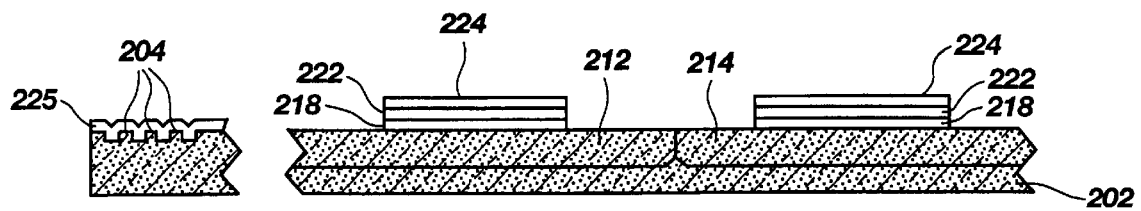
Figure 25:
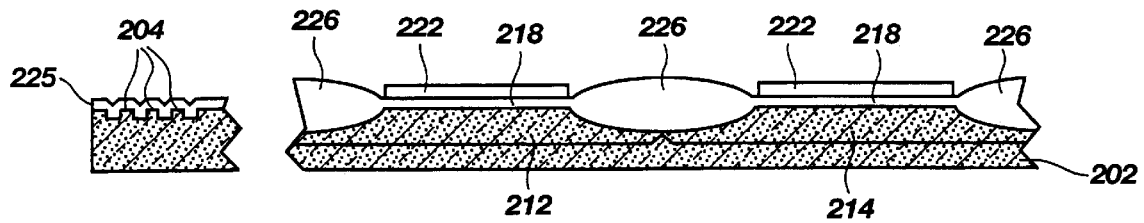
Figure 26:
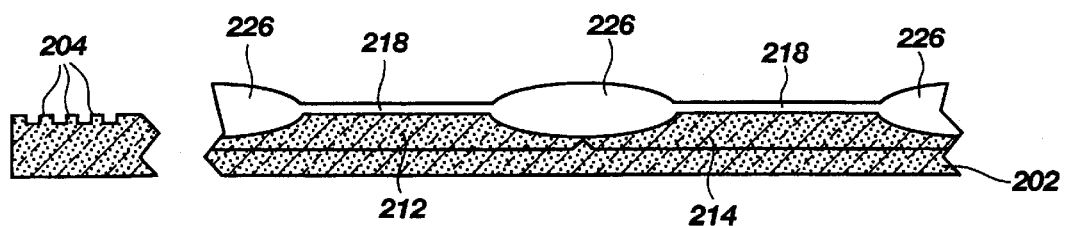
Figure 27:
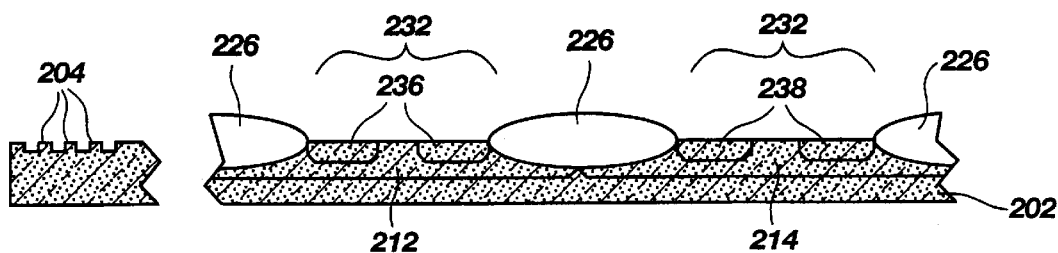
Figure 28:
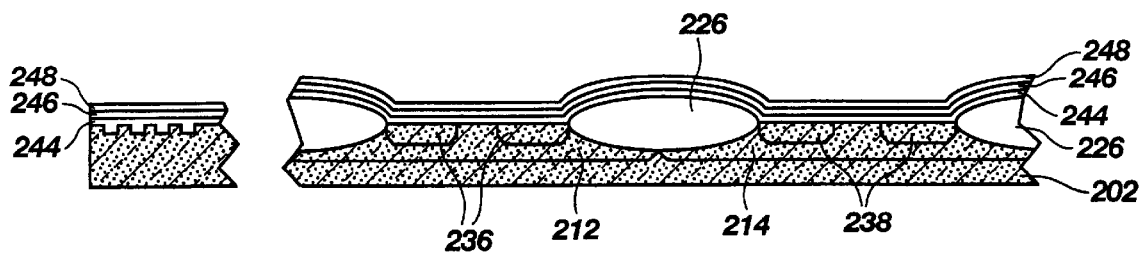
Figure 29:
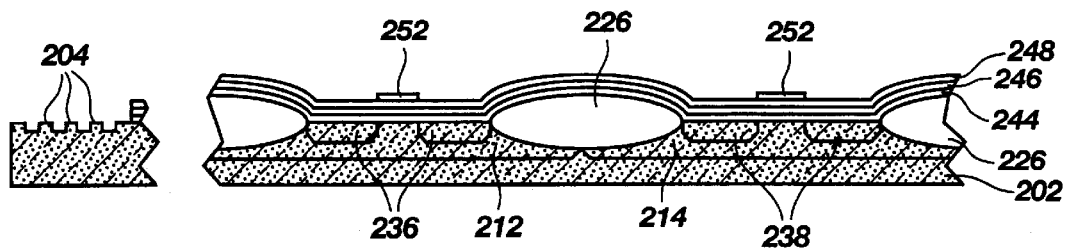
Figure 30:
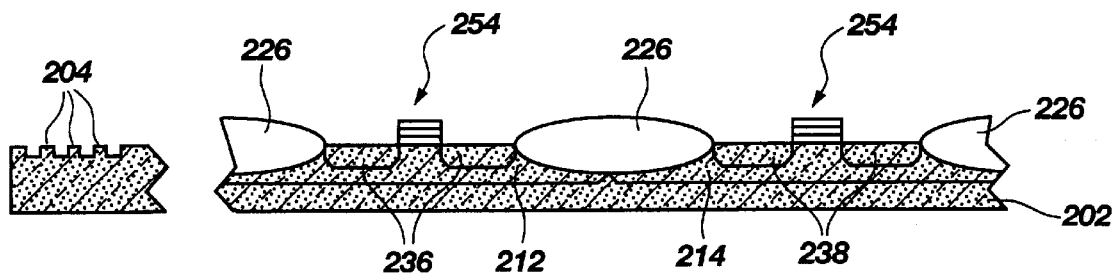
Figure 31:
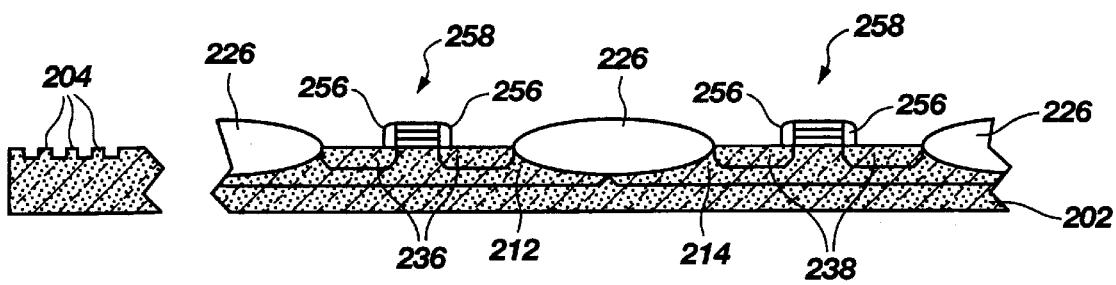

As shown in FIG. 19, a semiconductor wafer 190 incorporates a plurality of integrated circuit devices 192 (shown in increased scale and reduced numbers relative to the wafer 190) formed in the manner of FIGS. 1 through 18. Also, as shown in FIG. 20, an electronic system 194 includes an input device 195 and an output device 196 coupled to a processor device 197 which, in turn, is coupled to a memory device 198 incorporating the exemplary integrated circuit device 199 formed in a manner described in FIGS. 1 through 18.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of patterning a photoresist material for semiconductor component fabrication, comprising:

depositing said photoresist material over a semiconductor substrate;

forming a pattern into a portion of said photoresist material by exposing said portion of said photoresist material to radiation to form a latent image alignment mark;

aligning a mask having a desired aperture pattern defined therein to said latent image alignment mark and over said photoresist material; and exposing said photoresist material to a radiation source through said desired aperture pattern of said mask.

2. The method of claim 1, wherein exposing said portion of said photoresist material to radiation to form said latent image alignment mark comprises exposing a positive photoresist material to radiation to form said latent image alignment mark.

3. The method of claim 2, wherein exposing said positive photoresist material to radiation to form said latent image alignment mark comprises converting said positive photoresist material to a more soluble state and removing the exposed positive photoresist material with a solvent.

4. The method of claim 1, wherein exposing said portion of said photoresist material to radiation to form said latent image alignment mark comprises exposing a negative photoresist material to radiation.

5. The method of claim 4, wherein exposing said negative photoresist material to radiation to form said latent image alignment mark comprises converting said negative photoresist material to a less soluble state and removing unexposed portions of photoresist material with a solvent.

6. The method of claim 1, wherein forming said pattern into said photoresist material by exposing said portion of said photoresist material to radiation to form said latent image alignment mark comprises exposing said portion of said photoresist material to a light source.

7. The method of claim 1, wherein forming said pattern into said portion of said photoresist material by exposing said portion of said photoresist material to radiation to form said latent image alignment mark comprises exposing said portion of said photoresist material to X-rays.

8. The method of claim 1, wherein forming said pattern into said portion of said photoresist material by exposing said portion of said photoresist material to radiation to form said latent image alignment mark comprises exposing said portion of said photoresist material to an e-beam.

9. A method of patterning a photoresist material for semiconductor component fabrication, comprising:

depositing said photoresist material over a semiconductor substrate;

bleaching a pattern into a portion of said photoresist material by exposing said portion of said photoresist material to a specific light pattern to form a latent image alignment mark;

aligning a mask having a desired aperture pattern defined therein to said latent image alignment mark and over said photoresist material;

exposing said photoresist material to a radiation source through said desired aperture pattern of said mask.

10. The method of claim 9, wherein bleaching said portion of said photoresist material comprises exposing an undeveloped photoresist material layer to a light pattern.

11. The method of claim 9, wherein exposing said photoresist material to a radiation source through said desired aperture pattern comprises exposing a positive photoresist material to radiation to form said latent image.

12. The method of claim 11, wherein exposing said positive photoresist material to radiation to form said latent image alignment mark comprises converting said positive photoresist material to a more soluble state and removing the exposed positive photoresist material with a solvent.

13. The method of claim 9, wherein exposing said portion of said photoresist material to said specific light pattern to form said latent image alignment mark comprises exposing a negative photoresist material to radiation.

14. The method of claim 13, wherein exposing said negative photoresist material to radiation to form said latent image alignment mark comprises converting said negative photoresist material to a less soluble state and removing unexposed portions of photoresist material with a solvent.

15. The method of claim 9, wherein exposing said photoresist material to a radiation source comprises exposing said portion of said photoresist material to a light source.

16. The method of claim 9, wherein exposing said photoresist material to a radiation source comprises exposing said portion of said photoresist material to X-rays.

17. The method of claim 9, wherein exposing said photoresist material to a radiation source comprises exposing said portion of said photoresist material to an e-beam.

* * * * *

UNITED STATES PATENT AND TRADEMARK OFFICE
CERTIFICATE OF CORRECTION

PATENT NO. : 6,482,572 B1 Page 1 of 1
APPLICATION NO. : 09/513000
DATED : November 19, 2002
INVENTOR(S) : Jeffrey W. Honeycutt and Steven M. McDonald It is certified that error appears in the above-identified patent and that said Letters Patent is hereby corrected as shown below:

On the title page:
In item (56), "References Cited, OTHER PUBLICATIONS, 2nd column,
3rd line of 2nd entry,      change "*Inspectoin,*" to --*Inspection,*--

In the speification:
    COLUMN 7, LINE 44,      change "355 mj" to --355mj--
    COLUMN 8, LINE 40,      change "such a chemical" to --such as chemical--
    COLUMN 9, LINE 58      change "(PROM), a Electrically" to --(PROM), Electrically--

Signed and Sealed this

Fourteenth Day of November, 2006

JON W. DUDAS
*Director of the United States Patent and Trademark Office*